United States Patent [19]
Fernandes et al.

[11] Patent Number: 5,317,185
[45] Date of Patent: May 31, 1994

[54] SEMICONDUCTOR DEVICE HAVING STRUCTURES TO REDUCE STRESS NOTCHING EFFECTS IN CONDUCTIVE LINES AND METHOD FOR MAKING THE SAME

[75] Inventors: Mark G. Fernandes; Hisao Kawasaki, both of Austin, Tex.

[73] Assignee: Motorola, Inc., Schaumburg, Ill.

[21] Appl. No.: 836,169

[22] Filed: Feb. 18, 1992

Related U.S. Application Data

[63] Continuation of Ser. No. 609,681, Nov. 6, 1990, abandoned.

[51] Int. Cl.⁵ .............................................. H01L 21/88
[52] U.S. Cl. ...................................... 257/629; 257/798
[58] Field of Search ................... 357/71, 68; 257/629, 257/798

[56] References Cited

U.S. PATENT DOCUMENTS

| | | | |
|---|---|---|---|
| 4,288,829 | 9/1981 | Tango | 357/47 |
| 4,510,678 | 4/1985 | Eggers | 357/71 |

FOREIGN PATENT DOCUMENTS

| | | | |
|---|---|---|---|
| 56-70656 | 6/1981 | Japan . | |
| 60-74658 | 4/1985 | Japan . | |
| 60-101952 | 6/1985 | Japan . | |
| 60-176251 | 9/1985 | Japan . | |
| 60-254654 | 12/1985 | Japan | 354/45 |
| 61-239656 | 10/1986 | Japan | 357/71 |
| 62-193265 | 8/1987 | Japan . | |
| 63-224339 | 9/1988 | Japan . | |

OTHER PUBLICATIONS

Bartush et al, "Double dielectric process for multilevel metal", IBM TDB, vol. 22, No. 4, Sep. 79, pp. 1442-1445.

"The Influence of Stress on Aluminum Conductor Life", by T. Turner et al, The Proceedings of the IEEE International Reliability Physics Symposium, 1985, pp. 142-147.

"Line Width Dependence of Stresses in Aluminum Interconnect", by R. Jones, The Proceedings of IEEE International Reliability Physics Symposium, 1987, pp. 9-14.

Primary Examiner—Eugene R. LaRoche
Assistant Examiner—Viet Q. Nguyen
Attorney, Agent, or Firm—Patricia S. Goddard

[57] ABSTRACT

A semiconductor device has structures to reduced stress notching effects in conductive lines. In one form, the semiconductor device includes a semiconductor die which has a plurality of active conductive lines thereon. The plurality of conductive lines collectively has a first and a second outside edge. In close proximity to each of the first and the second outside edges is a stress reducing line. Each of the stress reducing lines is a non-active structure (in other words does not transmit signals) and functions to reduce stress concentrations on the plurality of active conductive lines which are imposed by overlying insulating and passivation layers. As a result of weakened stress concentrations, the amount of stress notching in the active conductive lines is reduced.

8 Claims, 2 Drawing Sheets

SEMICONDUCTOR DEVICE HAVING STRUCTURES TO REDUCE STRESS NOTCHING EFFECTS IN CONDUCTIVE LINES AND METHOD FOR MAKING THE SAME

This application is a continuation of prior U.S. application Ser. No. 07/609,681, filed Nov. 6, 1990, abandoned.

TECHNICAL FIELD OF THE INVENTION

The present invention relates to semiconductor devices in general, and more specifically to semiconductor devices designed to reduce the effects of stress notching in conductive lines.

BACKGROUND OF THE INVENTION

Semiconductor manufacturers are becoming more and more concerned about a phenomenon known in the industry as stress notching or metal notching in conductive lines. While stress notching is not completely understood, it is believed that notching in conductive lines occurs as a result of high stresses put on conductive lines by overlying oxide and passivation layers. Notches, which may also be considered as voids on the exterior surface of a conductive line, are believed to form in conductive lines to relieve points of high stress concentration. Aluminum and aluminum alloy lines, metals commonly used in semiconductor devices, are particularly susceptible to notching due to the high degree of thermal expansion coefficient mismatch between aluminum and surrounding insulating layers and due to the relatively low melting point of aluminum. The thermal expansion coefficient mismatch implies that each time the temperature of a semiconductor device changes, stresses are induced in aluminum lines because aluminum's thermal expansion coefficient is higher than that of surrounding materials. In order to relieve these stresses, aluminum atoms migrate, thereby forming stress notches. Because aluminum has a low melting point, the atoms can easily migrate, especially at relatively low elevated temperatures. Atom migration to relieve stress is also referred to as creep. Not only is stress notching, or creeping, temperature dependent, but also time dependent. The lower the temperature, the longer it takes for a notch to form. More information relating to stress notching can be found in an article entitled "The Influence of Stress on Aluminum Conductor Life," by T. Turner et al., which appeared in *The Proceedings of the IEEE International Reliability Physics Symposium*, 1985, pp. 142–147. Further information on the effects of stress on metal lines can be also be found in an article, entitled "Line Width Dependence of Stresses in Aluminum Interconnect," by R. Jones, *The Proceedings of the IEEE International Reliability Physics Symposium*, 1987, pp. 9–14.

Several proposals to reduce stress notching and to reduce the effects of stress notching are known. One approach is to change the material used for conductive lines to one which is less susceptible to metal notching, for example copper or tungsten. Using copper for metal interconnect lines has several problems, one being that copper is very difficult to etch. Another problem in using copper is that the adhesion between copper and overlying oxide and passivation layers is poor and can pose reliability concerns. While adding copper to aluminum conductive lines may reduce notching, beyond a certain copper content, device performance begins to degrade. Furthermore, as conductive line geometries continue to shrink, the addition of copper in aluminum lines seems to prove less effective. The use of tungsten for conductive lines has also been examined, and is implemented in some instances. A disadvantage in using tungsten in place of aluminum or aluminum alloys is that tungsten has a higher resistivity, therefore signal speed is reduced.

Another approach to solving stress notching is to form a cap on the conductive lines. Caps can be formed from titanium nitride, tungsten, or titanium-tungsten compounds. These materials have higher melting points than aluminum and therefore have a higher resistance to stress notching. A disadvantage in using these caps is that at least one additional process step is required to form the caps. Yet another approach in reducing notches is to reduce the stresses created by oxide and passivation layers which overlie conductive lines. Experimentation has been performed in this area, for example by varying the rate, temperature, and/or pressure at which these layers are deposited and by varying the chemical composition of these layers, yet much remains to be understood about stresses in oxide and passivation films.

Therefore, for the reasons discussed previously, a need exists for an improved semiconductor device which has reduced effects of stress notching in conductive lines, and more specifically for such device to also maintain existing device performance levels without requiring additional processing steps.

BRIEF SUMMARY OF THE INVENTION

The aforementioned needs are fulfilled with the present invention which in one form is a semiconductor device having structures which function to reduce stress notching effects in conductive lines. A semiconductor die has a plurality of active conductive lines thereon which are substantially parallel in at least a portion of the semiconductor die. The plurality of active conductive lines has a first and a second outside edge. Positioned in close proximity to each of the first and second outside edges is a stress reducing line which acts as a non-active structure in the semiconductor device.

DETAILED DESCRIPTION OF A PREFERRED EMBODIMENT

Figure 1:
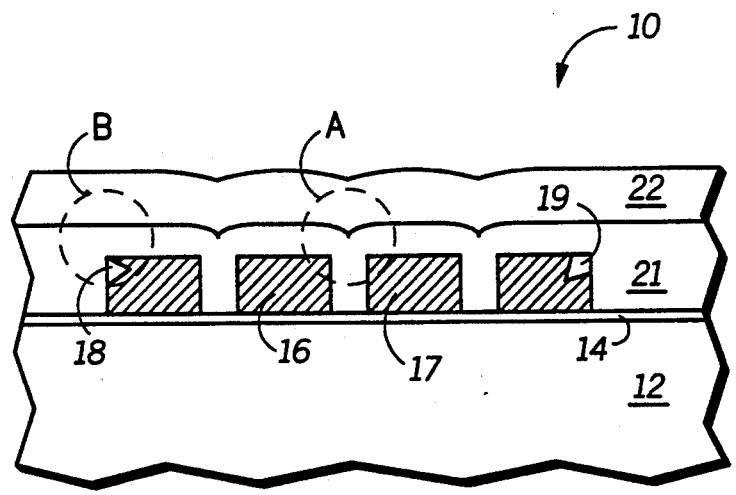
FIG. 1 is a cross-sectional illustration of known stress notching in conductive lines of a semiconductor device.

An example of stress notching in conductive lines of semiconductor device, as known in the semiconductor industry, is represented by a cross-sectional view in FIG. 1. A semiconductor die 10 (not entirely shown) has a substrate material 12 with a first insulating layer 14 which overlies the substrate material. Substrate material 12 is typically a semiconductor material such as silicon or gallium-arsenide. In place of a semiconductor material, other conducting materials commonly used in the fabrication of semiconductor devices may be used for substrate material 12, such as aluminum, aluminum alloys, tungsten, polysilicon, or the like. Materials used for first insulating layer 14 include oxides or nitrides of a variety of materials, such as silicon or titanium. First insulating layer 14 may also be doped to achieve specific properties, as is known in the industry. Overlying first insulating layer 14 is a plurality of conductive lines, such as lines 16 and 17. The plurality of conductive lines are used to carry current or signals throughout the semiconductor device. Many semiconductor manufacturers use aluminum or aluminum alloys for conductive lines, although other conductive materials such as tungsten or polysilicon may be used.

As discussed previously, aluminum lines are susceptible to stress notching. Examples of notching are illustrated in FIG. 1 by notches 18 and 19. The shape of the notches illustrated in FIG. 1 are not necessarily representative of the appearance of actual notches. Notches typically occur on an exterior surface of a conductive line at the intersection of two edges of the line, i.e. along corners. Although notches may be located in other portions of the conductive lines, corners are typically under the most severe stress conditions. Stress is created in the conductive lines due to overlying insulating and passivation layers, such as a second insulating layer 21 and a passivation layer 22 of FIG. 1. Second insulating layer 21 is used to insulate various conducting features or conducting layers from one another and is usually an oxide or nitride of silicon, although other insulating materials may be used. Passivation layer 22 is often included on semiconductor die 10 in order to protect the die from contamination by the surrounding environment. A suitable passivation material is silicon nitride.

As discussed in the background section, the stresses caused by second insulating layer 21 and passivation layer 22 are a result of a mismatch in the coefficients of thermal expansion of the conductive line material, such as aluminum, and the overlying insulating and passivation materials. Similarly, stresses can also be created by the same mismatch between the conductive line material and the substrate material. The thermal expansion coefficient mismatch implies that as the temperature of the device changes, the expansion of the various materials occurs at a different rate. More specifically, aluminum lines expand more than the overlying oxide or nitride layers for any given temperature increase. Because the aluminum lines are restricted by the overlying insulating and passivation layers, the expansion of the lines is limited and the lines become compressively stressed. Likewise, for a decrease in temperature, aluminum lines contract more easily, but are restrained from contracting by the overlying insulating and passivation layers. This restraint causes the lines to be under tensile stress. Although conductive lines are either all under compression or all under tension, the degree of stress within any portion of a line varies. For example, stress concentrations are typically much higher near sharp edges. Thus, in the case of aluminum lines, notches are most likely to occur near sharp edges or corners in order to relieve the high stresses located in these areas.

Additionally, notches most often occur on the outermost lines of a plurality of conductive lines. While notching may also occur on inner lines, problems associated with notches on outermost lines are more severe due to the higher number of notches on outermost lines. This pattern is illustrated in FIG. 1 in that the innermost conductive lines, such as conductive line 16, do not illustrate as much notching while the two outermost lines have notches 18 and 19, respectively, which have formed near a sharp edge or corner. The reason notches most often occur on outermost lines can also be explained by examining the stress concentrations on various conductive lines. The stress concentrations on the innermost lines are less than the stress concentrations on the outermost lines. For example, the area enclosed by dashed circle A is symmetric about a vertical axis, such that the forces acting on one side of that axis are balanced by equal and opposite forces acting on the other side of the axis. On the other hand, the area enclosed by dashed circle B, which includes an outermost conductive line, lacks the symmetry which the innermost conductive lines display. Thus, there is an imbalance in forces on outermost conductive lines which is frequently equilibrated by the formation of notches.

Figure 2A:
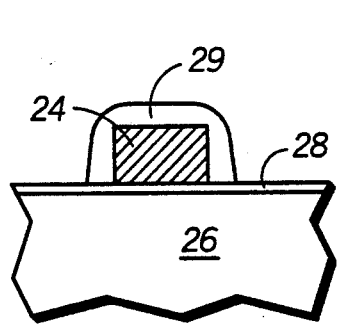
FIGS. 2A and 2B are cross-sectional illustrations of stress conditions that might exist in conductive lines of a semiconductor device.
Figure 2B:
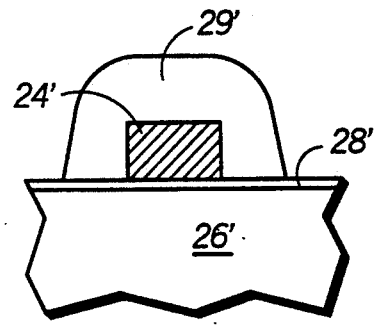

Another factor in the amount of stress which is exerted on a conductive line is the amount of material overlying the line. A conductive line which has a thin overlying layer of insulating material will be under less stress than a similar line having a thick overlying insulating material. FIGS. 2A and 2B respectively illustrate an example of varying stress conditions which result from insulating materials having different first and second thickness. In FIG. 2A, a conductive line 24 overlies a substrate material 26 and a first insulating layer 28. A thin second insulating layer 29 is formed over conductive line 24. FIG. 2B illustrates a similar conductive line 24', a first insulating layer 28', a substrate material 26', and a thick second insulating layer 29'. The difference between FIG. 2A and FIG. 2B is the thickness in the second insulating layers, 29 and 29' respectively. As a result of this difference, the stresses on conductive line 24 will be different than those on conductive line 24'. For example, if conductive line 24 contracts, it is subjected to tensile stress for the reasons described previously. Likewise, if conductive line 24' contracts under the same conditions, it is also under a tensile stress, however, the tensile stress of conductive line 24' is larger than that of conductive line 24. The larger stress on conductive line 24' is due to the thicker overlying second insulating layer 29'. Because more material overlies conductive line 24', it is more restricted from contracting (or expanding) than conductive line 24, thus it builds up more stress when contracting. Applying this concept to the plurality of conductive lines in FIG. 1, it is apparent that the outermost lines have more surrounding insulating and passivation materials than do the innermost conductive lines. Therefore, the outermost lines have more severe stress conditions and are more likely to relieve these stresses by notching.

Stress notching in conductive lines is undesirable because notches pose a potential reliability problem and can degrade device performance. From a reliability standpoint, notches may form such that a conductive line becomes discontinuous and unable to transmit a signal. Notches which form at a grain boundary are particularly detrimental to a device because it is quite easy for a notch to propagate along a grain boundary and possibly sever a conductive line completely. From a performance standpoint, the presence of notches can alter the resistivity of a conductive line, thereby changing the speed at which a signal is transmitted. Resistivity changes due to notching are becoming more of a concern as conductive line dimensions are reduced. The presence of a notch in a submicron line has more of an impact on resistivity changes than a notch in a larger line. Therefore, as integrated circuits continue to use smaller dimensions, stress notching in conductive lines becomes more of a concern.

Figure 3:
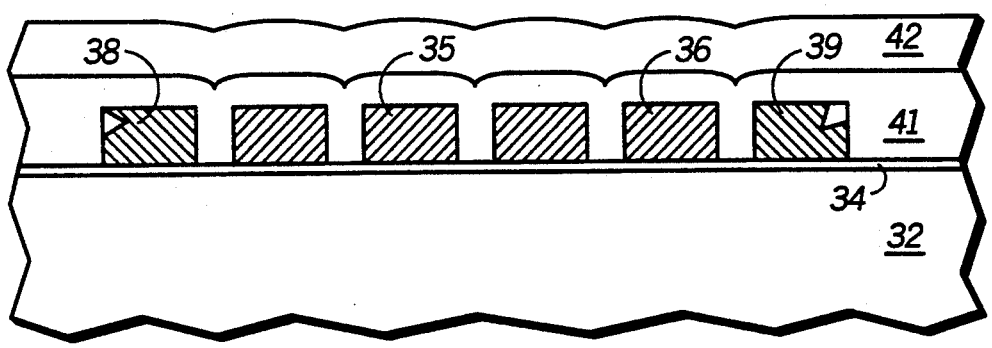
FIG. 3 is a cross-sectional illustration of conductive lines of a semiconductor device in accordance with the present invention.

The present invention reduces the effects of stress notching on the performance of a semiconductor device. FIG. 3 illustrates one embodiment of the invention in which a semiconductor device has structures to reduces the stress notching effects in conductive lines. A semiconductor die 30 (not entirely shown) includes a substrate material 32 with an overlying first insulating 34. Substrate material 32 might be of silicon or an intermediate layer of a semiconductor device such as aluminum or polysilicon. First insulating layer 34 is typically an oxide or nitride, such as $SiO_2$ or $Si_3N_4$. Overlying the substrate material is a plurality of conductive lines, such as 35 and 36, much like the conductive lines of FIG. 1. The plurality of conductive lines in FIG. 3 has four substantially parallel conductive lines, each with the same cross-hatching, although exactly four lines are not necessary to practice the present invention. In close proximity to each outer edge of the two outermost conductive lines of the plurality of conductive lines is a stress reducing line, such as stress reducing lines 38 and 39. Different cross-hatching is used to distinguish stress reducing lines 38 and 39 from the plurality of conductive lines, such as 35 and 36, although all may be of the same material. Stress reducing lines 38 and 39 are non active structures within the semiconductor device, in other words these lines are not used to transmit signals, although it may be desirable to connect the stress reducing lines to ground. One might consider stress reducing lines 38 and 39 to be "dummy" or "sacrificial" lines. The purpose of stress reducing lines 38 and 39 i to reduce the amount of stress on the active conductive lines, in other words lines which are used to transmit signals, which is imposed by both an overlying second insulating layer 41 and an overlying passivation layer 42. From the previous discussion it follows that the most severe stress conditions will be on the outermost lines of a given plurality of lines. In FIG. 3, the outermost lines are stress reducing lines 38 and 39. Therefore, the stress reducing lines are subjected to the most severe stress conditions while the stress on the active conductive lines is relieved. In turn, the amount of stress notching in the active conductive lines is reduced.

The easiest and most cost effective way to implement the embodiment of the present invention illustrated in FIG. 3 is to form the stress reducing lines of the same material as the plurality of conductive lines. In doing this, no additional processing steps are required. For instance, if conductive lines are made of aluminum, the stress reducing lines can be formed of aluminum at the same time as the conductive lines. Even though notching may occur in the stress reducing lines, the performance and reliability of the device is unaffected since these lines are non-active structures of the device. It may also be desirable to form stress reducing lines 38 and 39 from a different material than that of the active conductive lines, however this would require additional deposition, masking and etching steps. The use of stress reducing lines need not be employed on all sets or pluralities of conductive lines, but would be most useful on conductive lines which are most susceptible to stress notching. For instance, a group of long, narrow lines, such as busses which are often used to transfer data in integrated circuits, would strongly benefit from the use of stress reducing lines. As illustrated in FIG. 3, stress reducing lines 38 and 39 are each of the same dimensions as each of the plurality of conductive lines. Stress reducing lines need not be of the same dimensions, for example the stress reducing lines may be thinner than the active conductive lines in order to conserve space or they may be wider in order to further reduce stresses on the active conductive lines.

Figure 4:
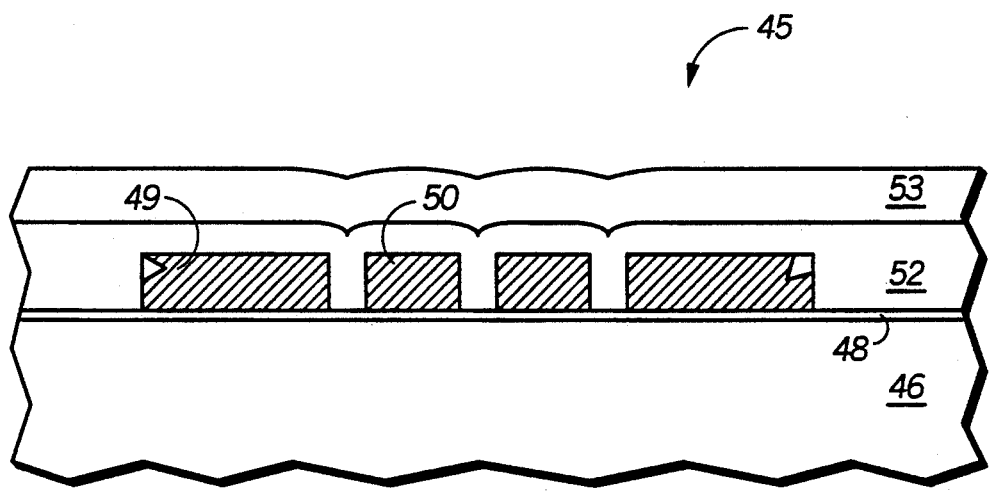
FIG. 4 is a cross-sectional illustration of another embodiment of a semiconductor device in accordance with the present invention.

Another embodiment in accordance with the present invention is illustrated in FIG. 4. Rather than forming non-active, stress reducing lines, the outermost lines of a plurality of conductive lines within a semiconductor device are modified to reduce the effects of stress notching. A semiconductor die 45 (not entirely shown) includes a substrate material 46 and a first insulating layer 48. Overlying the substrate material is a plurality of active conductive lines, such as lines 49 and 50. Four active conductive lines are illustrated; however, any number of lines greater than two may be used in conjunction with the embodiment of the present invention illustrated in FIG. 4. A second insulating layer 52 and a passivation layer 53 overlie the plurality of conductive lines. As discussed previously, the overlying insulating and passivation layers create stress in the conductive lines which leads to stress notching. Each of the two outermost active conductive lines, including line 49, are wider than each of the remaining active conductive lines. Therefore, even though notching may occur in the outermost active conductive lines, the performance of the device may be acceptable. As an example, a notch or group of notches may change the resistivity of a 1.0 μm line by 1.5%, which by some manufacturer's standards might be unacceptable. Yet, by increasing this line to 2.0 μm, in other words doubling the width of the line, the change in resistivity would be halved to 0.75% and considered acceptable by some standards. Thus, the effects of notching can be minimized by tailoring the dimensions of the outermost active conductive lines. Each of the outermost conductive lines in FIG. 4 are illustrated as being twice the width of each of the remaining lines; however, exact proportions may vary from device to device depending on the degree of notching which must be controlled. In designing a semiconductor device in accordance with the present invention, one must take into account that signals may be transmitted faster in the wider, outermost lines than in each of the remaining conductive lines.

The present invention reduces the effects of stress notching in conductive lines in a semiconductor device. While one embodiment of the present invention implements structures to bear the stress created by overlying insulating and passivation films, another embodiment modifies the design of conductive lines in order to reduce the effects of stress notches on device performance. The invention can be practiced without changing materials conventionally used as conductive lines and does not require additional processing steps. Implementation of the present invention does not significantly increase the size of a semiconductor device, particularly if only selected portions of a device, such as busses, are modified to incorporate the invention.

Thus it is apparent that there has been provided, in accordance with the invention, a semiconductor device having structures to reduce stress notching effects in conductive lines and a method for making the same. Although the invention has been described and illustrated with reference to specific embodiments thereof, it is not intended that the invention be limited to these illustrative embodiments. Those skilled in the art will recognize that modifications and variations can be made without departing from the spirit of the invention. For example, use of the invention is not limited to use in packages having aluminum conductive lines, but may be used on any lines in a semiconductor device used to transmit signals. Nor is the invention limited to using the number of the lines illustrated. Furthermore, the invention need not be limited to use on bus lines in a semiconductor device. Any plurality of conductive lines which has potential for stress notching can benefit from the present invention. Therefore, it is intended that this invention encompass all such variations and modifications as fall within the scope of the appended claims.

We claim:

1. A semiconductor device having structures to reduce stress notching effects in conductive lines comprising:
   a semiconductor die having a plurality of active conductive lines thereon which are each used to transmit signals, are substantially parallel in at least a portion of the semiconductor die, are substantially equidistant from one another being separated by a first distance, and are substantially in a common plane of the semiconductor die, the plurality of active conductive lines having a first and a second outermost active conductive line, and wherein each of the first and the second outermost active conductive lines are substantially wider than the remaining active conductive lines.

2. The semiconductor device of claim 1 wherein each of the first and the second outermost active conductive lines is at least twice the width of each of the remaining of active conductive lines.

3. The semiconductor device of claim 1 wherein each of the plurality of active conductive lines is comprised of one of either aluminum or an aluminum alloy.

4. The semiconductor device of claim 1 wherein any other conductive lines in the common plane of the semiconductor die which are substantially parallel to the plurality of active conductive lines are separated from the first and second outermost active conductive lines by a distance greater than the first distance.

5. A semiconductor device having structures to reduce stress notching effects in conductive lines comprising:
   a semiconductor substrate;
   a plurality of active conductive lines overlying the semiconductor substrate, wherein the lines run substantially parallel to one another in a portion of the device, lie substantially in a common plane of the device, and are separated one from another by a space of a first width;
   a first and a second outermost conductive line adjacent opposing sides of the plurality of active conductive lines, each outermost conductive line being within the common plane, parallel to the plurality of active conductive lines, and separated from the plurality of active conductive lines by a space having the first width; and
   an insulating layer overlying the plurality of active conductive lines and the first and second outermost conductive lines;
   wherein the first and second outermost conductive lines are each substantially wider than each line of the plurality of active conductive lines; and
   wherein any other conductive lines within the common plane which are parallel to the plurality of active conductive lines are separated from the first and second outermost conductive lines by a space greater than the first width.

6. The semiconductor device of claim 5 wherein each line of the plurality of active conductive lines is comprised of aluminum.

7. The semiconductor device of claim 5 wherein the first and second outermost lines are signal lines.

8. The semiconductor device of claim 5 wherein the first and second outermost conductive lines are each at least twice as wide as each line of the plurality of active conductive lines.

* * * * *